United States Patent
Lin et al.

(10) Patent No.: US 11,309,471 B2
(45) Date of Patent: Apr. 19, 2022

(54) FLIP-CHIP LIGHT-EMITTING MODULE

(71) Applicant: AZUREWAVE TECHNOLOGIES, INC., New Taipei (TW)

(72) Inventors: Kung-An Lin, New Taipei (TW); Chung-Che Yang, New Taipei (TW); Hung-Wei Lin, New Taipei (TW); Hsiang-Yun Cheng, New Taipei (TW)

(73) Assignee: AZUREWAVE TECHNOLOGIES, INC., New Taipei (TW)

( * ) Notice: Subject to any disclaimer, the term of this patent is extended or adjusted under 35 U.S.C. 154(b) by 32 days.

(21) Appl. No.: 16/835,624

(22) Filed: Mar. 31, 2020

(65) Prior Publication Data
US 2020/0227608 A1 Jul. 16, 2020

Related U.S. Application Data

(62) Division of application No. 16/101,677, filed on Aug. 13, 2018, now abandoned.

(30) Foreign Application Priority Data

Jun. 6, 2018 (TW) .................................. 107119481

(51) Int. Cl.
*H01L 33/62* (2010.01)
*H01L 33/64* (2010.01)
*H01L 33/38* (2010.01)
*H01L 33/48* (2010.01)

(52) U.S. Cl.
CPC ............ *H01L 33/62* (2013.01); *H01L 33/486* (2013.01); *H01L 33/64* (2013.01); *H01L 33/641* (2013.01); *H01L 33/38* (2013.01)

(58) Field of Classification Search
CPC ..... H01L 33/486; H01L 33/62; H01L 33/642; H01L 33/644
See application file for complete search history.

(56) References Cited

U.S. PATENT DOCUMENTS

| 2005/0139846 | A1* | 6/2005 | Park | H01L 33/642 257/98 |
| 2010/0084673 | A1* | 4/2010 | Ho | H01L 33/62 257/98 |
| 2011/0147779 | A1* | 6/2011 | Kang | H01L 33/486 257/98 |
| 2013/0258663 | A1 | 10/2013 | Woodgate et al. | |

(Continued)

FOREIGN PATENT DOCUMENTS

| JP | 60175476 A | 9/1985 |
| JP | 2005268737 A * | 9/2005 |

(Continued)

*Primary Examiner* — Aaron J Gray
(74) *Attorney, Agent, or Firm* — Li & Cai Intellectual Property (USA) Office

(57) ABSTRACT

A flip-chip light-emitting module includes a thermal dissipation substrate, a package assembly, and a light-emitting chip. The package assembly includes a frame surrounding the thermal dissipation substrate, and a lens unit disposed on the frame. The frame includes a conductive path. The light-emitting chip is disposed on the thermal dissipation substrate, and includes a top conductive contact and a light-emitting surface at the same side. The top conductive contact is electrically connected with the conductive path by a conductor.

5 Claims, 9 Drawing Sheets

(56) References Cited

U.S. PATENT DOCUMENTS

2014/0037247 A1* 2/2014 Mathai ................ G02B 6/4228
385/52
2018/0062057 A1* 3/2018 Sweegers ................ H01L 33/64

FOREIGN PATENT DOCUMENTS

| JP | 2005268737 A | 9/2005 |
| JP | 2006344978 A | 12/2006 |

* cited by examiner

FLIP-CHIP LIGHT-EMITTING MODULE

CROSS-REFERENCE TO RELATED PATENT APPLICATION

This application is a divisional application of Ser. No. 16/101,677 filed on Aug. 13, 2018, and entitled "FLIP-CHIP LIGHT-EMITTING MODULE", now pending, the entire disclosures of which are incorporated herein by reference.

FIELD OF THE DISCLOSURE

The present disclosure relates to a light-emitting module, and more particularly to a flip-chip light-emitting module.

BACKGROUND OF THE DISCLOSURE

Human cannot live without lighting, and lighting devices have evolved from traditional incandescent lamps to other light-emitting elements, such as light-emitting diodes. The light-emitting diodes have advantages of small size, low energy consumption, and low driving voltage. After the light-emitting diode is assembled with a main circuit board having driving circuit to form a module, this module can be applied to other devices as a light source, and it is wildly applied to fields of home appliance indicator, backlight of display, illumination module of portable electronic device, light source of detection device, or vehicle lamp.

Referring to FIG. 1, a conventional light-emitting module 9 includes a main circuit board 91, a light-emitting chip 92, two wires 93, and a package assembly 94. The light-emitting chip 92 is disposed on the main circuit board 91, and includes two conductive contacts 921 on two opposite sides and an optical axis L. Each wire 93 has two ends, wherein one end is electrically connected to the corresponding conductive contact 921, and the other end is electrically connected to the main circuit board 91. The package assembly 94 includes a support 941 disposed at the outside of the light-emitting chip 92, and a lens 942 which is disposed on the support 941 and opposite to the light-emitting chip 92.

The main circuit board 91 is made of polymers, and thus it has poor heat conductivity and heat-dissipating ability. If there is no structural design for heat dissipation, the light-emitting chip 92 attached thereto is easily overheated and damaged due to the poor heat-dissipating ability. Furthermore, wire bonding is often used for packaging, therefore reserving space between the light-emitting chip 92 and the support 941 is necessary in order to prevent the support 941 from pressing the wires 93 and to prevent the wires 93 from damaging or falling off. Similarly, the reserved space along the optical axis L of the support 941 must not be too short, or else the risk of pressing the wires 93 is still remained. Therefore, this packaging design has an inadequacy of difficulty for further decreasing the size of the light-emitting module 9.

SUMMARY OF THE DISCLOSURE

In response to the above-referenced technical inadequacies, the present disclosure provides a flip-chip light-emitting module that has better heat-dissipating ability and smaller size.

In one aspect, the present disclosure provides a flip-chip light-emitting module including a thermal dissipation substrate, a package assembly, and a light-emitting chip. The package assembly includes a frame surrounding the thermal dissipation substrate, and a lens unit disposed on the frame. The frame includes a conductive path. The light-emitting chip is disposed on the thermal dissipation substrate, and includes a top conductive contact and a light-emitting surface at the same side. The top conductive contact is electrically connected to the conductive path through a conductor.

Therefore, the connection of the light-emitting chip and the thermal dissipation substrate can effectively improve heat dissipation. In addition, through the conductive path of the package assembly and the conductor, the light-emitting chip can electrically connect to an external component, such as a main circuit board, in the form of flip-chip; therefore, it is unnecessary to reserve space for wire bonding, and it can effectively reduce the size of the flip-chip light-emitting module and contribute to the application of miniaturized products. Otherwise, since the light-emitting chip can be packaged by flip-chip technique instead of wire bonding technique, an electronic product with the light-emitting chip can be rapidly switched without signal delay.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the detailed description and the accompanying drawings, in which.

DETAILED DESCRIPTION OF THE EXEMPLARY EMBODIMENTS

Figure 1:
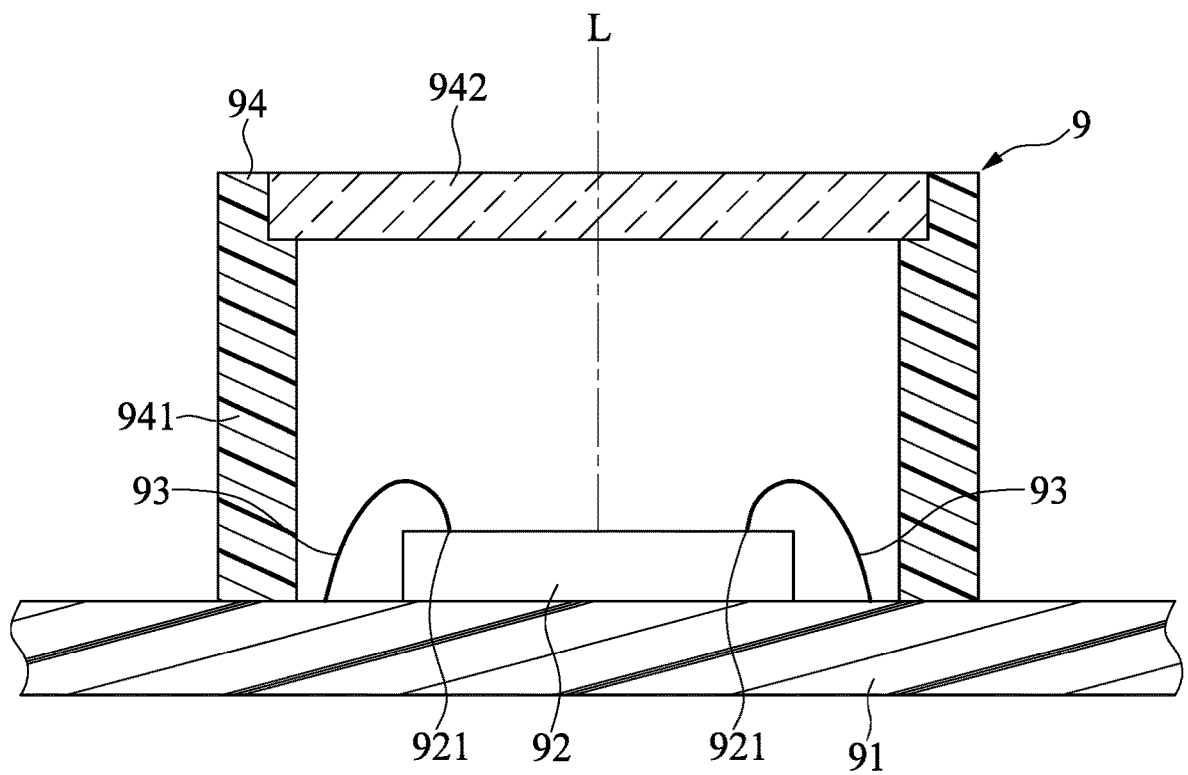
FIG. 1 is a cross-sectional view illustrating a conventional light-emitting module.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 2:
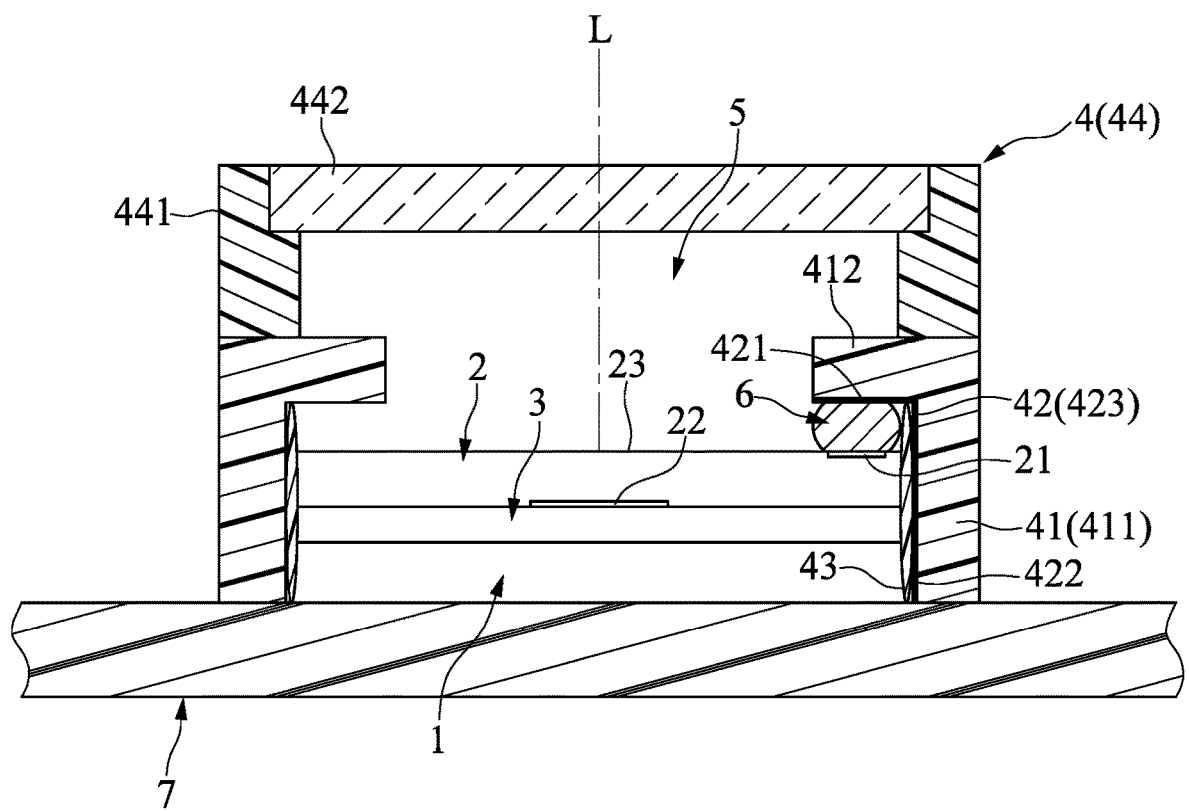
FIG. 2 is a cross-sectional view showing a first embodiment of the present disclosure.

Referring to FIG. 2, a first embodiment of the present disclosure provides a flip-chip light-emitting module adapted for mounting on a main circuit board 7 in order to cooperate with the main circuit board 7, or adapted for electrically connecting to an external power source and being driven. The method and field of use are not the focus of the present invention, thus they are not described in detail herein.

The flip-chip light-emitting module includes a thermal dissipation substrate 1, a light-emitting chip 2, a conductive adhesive layer 3, a package assembly 4, and a conductor 6.

The thermal dissipation substrate 1 is selected from the group consisting of an albumin substrate, a copper substrate, and any substrates having good heat-dissipating or heat-conductive abilities. One side of the thermal dissipation substrate 1 is adapted for electrically connecting to the main circuit board 7, and another side of the thermal dissipation substrate 1 is connected to light-emitting chip 2.

The light-emitting chip 2 is disposed on the thermal dissipation substrate 1, and includes a top conductive contact 21, a bottom conductive contact 22, a light-emitting surface 23, and an optical axis L extending outward from the light-emitting surface 23. The top conductive contact 21 and the light-emitting surface 23 are at the same side that is opposite to the thermal dissipation substrate 1. The bottom conductive contact 22 electrically connects to the thermal dissipation substrate 1; preferably, the bottom conductive contact 22 is adhered to the thermal dissipation substrate 1 through the conductive adhesive layer 3. The top conductive contact 21 is one of the positive electrode and negative electrode, and the bottom conductive contact 22 is the other one of the positive electrode and negative electrode. The light-emitting chip 2 is selected from the group consisting of light-emitting diodes (LED), resonant-cavity light-emitting diodes (RCLED), and vertical-cavity surface-emitting laser chips (VCSEL). In the first embodiment, a non-limiting example of the light-emitting chip 2 is the vertical-cavity surface-emitting laser chip.

The package assembly 4 defines a light channel 5 extending along the optical axis L, and includes a frame 41, a conductive path 42, a filling layer 43, and a lens unit 44. The frame 41 surrounds the thermal dissipation substrate 1, and includes a side wall 411 surrounding the lateral of the thermal dissipation substrate 1, and an extension wall 412 extending from the side wall 411 to the top conductive contact 21. The extension wall 412 and the top conductive contact 21 face each other. The frame 41 is made of plastic, ceramic, or any insulating material, wherein, in the first embodiment, since ceramic has strong mechanical strength and high heat resistance, the frame 41 is made of ceramic, but is not limited thereto.

Figure 3:
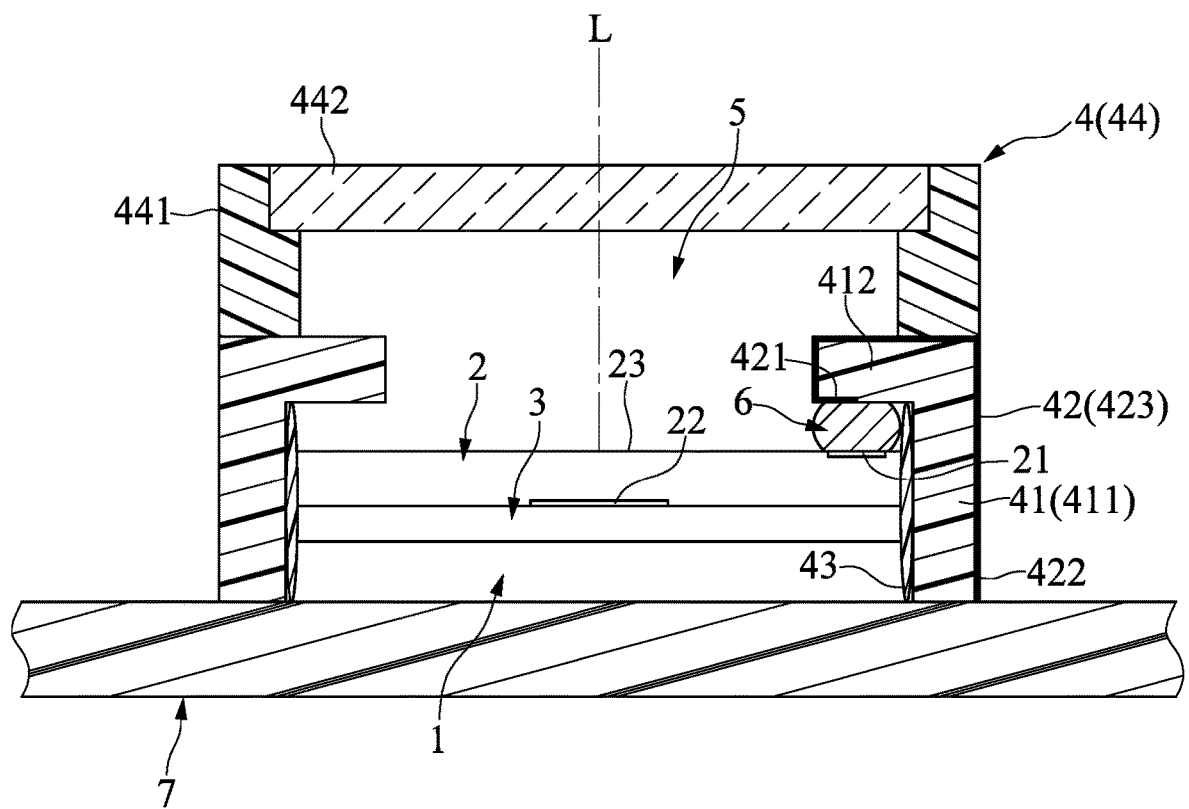
FIG. 3 is a partial cross-sectional view according to the first embodiment of the present disclosure, illustrating a conductive path formed at an outer surface of a frame.
Figure 4:
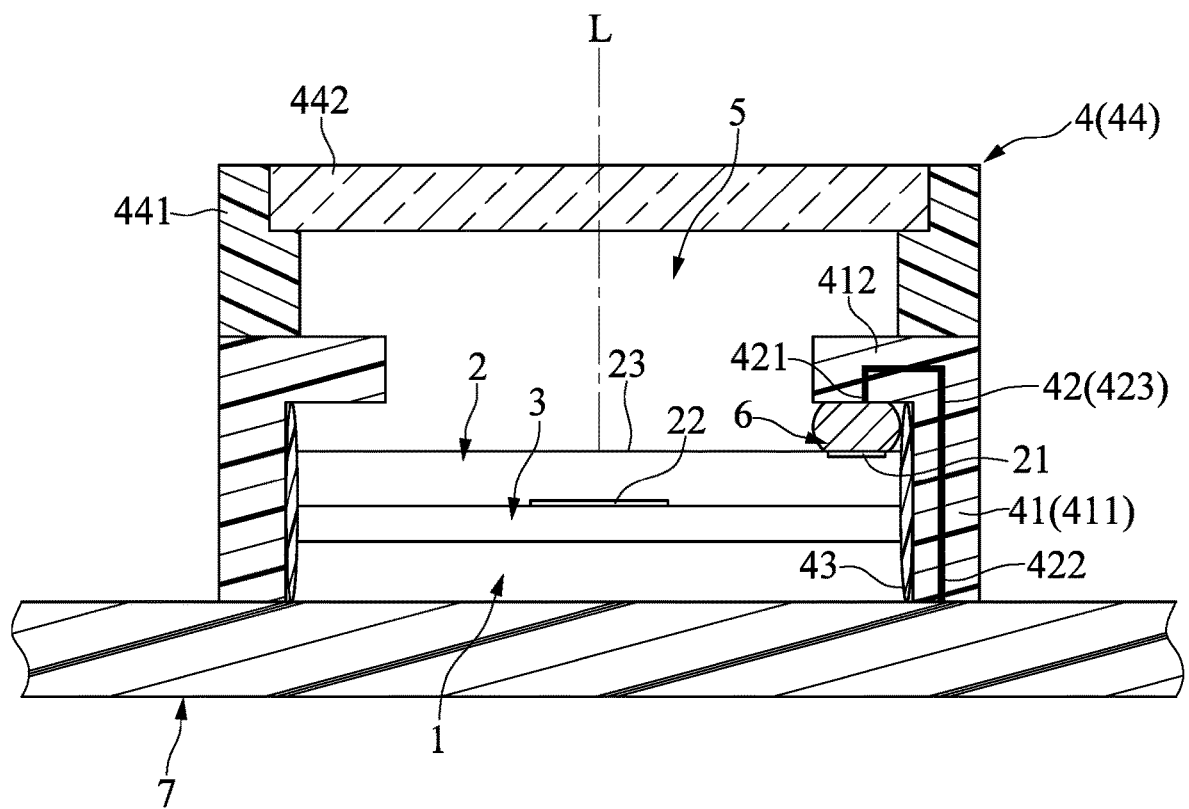
FIG. 4 is a partial cross-sectional view according to the first embodiment of the present disclosure, illustrating conductive path formed inside the frame.

The conductive path 42 is disposed on the frame 41, and includes an internal connective end 421, an external connective end 422, and a path body 423 extending between the internal connective end 421 and the external connective end 422. The external connective end 422 is on the side wall 411 for electrically connecting to the external component, e.g. the main circuit board 7 or the external power source. The internal connective end 421 is on the extension wall 412 and is electrically connected to the top conductive contact 21 through the conductor 6. The path body 423 is disposed on one of the inner surface of the frame 41 (see FIG. 2), the outer surface of the frame 41 (see FIG. 3), and the interior of the frame 41 (see FIG. 4). In the first embodiment, the path body 423 is disposed on the outer surface of the frame 41, but is not limited thereto. The conductive path 42 is selected from the group consisting of wires, sheet metal springs, and the like with conductance. In the first embodiment, a non-limiting example of the conductive path 42 is a wire.

The filling layer 43 is disposed on the inner side of the frame 41, and connects the thermal dissipation substrate 1 and the light-emitting chip 2. Therefore, the filling layer 43 is filled in a gap which is defined by the frame 41, the thermal dissipation substrate 1 and the light-emitting chip 2, and the filling layer 43 makes the structure more stable and improves the strength of the flip-chip light-emitting module.

The lens unit 44 is disposed on the frame 41, and includes a support 441 and a lens 442. The support 441 is made of an opaque material, and it is extended from the frame 41 along the optical axis L. The support 441 and the frame 41 together define the light path 5 around the optical axis L. There is no limitation to the manner of how to mount the support 411 on the frame 41 and it can be adopted in any manner; in the first embodiment, the use of a viscose to bind the two is described, but is not limited thereto. The lens 442 is disposed on the frame 441 and in the light channel 5. The lens 442 is selected from a planar lens, a condenser lens, a divergent lens, and any other types of lenses. The lens 442 is made of transparent plastic or glass. The transparent plastic is selected from polymethylmethacrylate (PMMA), polycarbonate (PC), polyetherimide (PEI), cyclo olefin copolymer (COC), and their mixture. In the first embodiment, the lens 442 is a planar lens and is made of glass. However, the selection of the foregoing structures and materials is just exemplary and is not limited thereto.

It should be noted that the number of the lenses 442 of the lens unit 44 may be two or more, and the types or the materials of the lenses 442 may be the same or different, depending on particular implementations.

The conductor 6 is disposed between the light-emitting chip 2 and the package assembly 4, and the conductor 6 electrically connects the conductive path 42 and the top conductive contact 21. In this embodiment, the conductor 6 is, but not limited to, a soldering ball. The conductor 6 is interposed between the extension wall 412 of the frame 41 and the top conductive contact 21 of the light-emitting chip 2, thus it connects the conductive path 42 on the extension wall 412 and the top conductive contact 21 after remelting.

The manufacturing method of the flip-chip light-emitting module is exampled as: Firstly, adhere the thermal dissipation substrate 1 and the light-emitting chip 2, and then sold a soldering ball as the conductor 6 on the top conductive contact 21.

Secondly, insert the thermal dissipation substrate 1 and the light-emitting chip 2 into the frame 41, and push the frame 41 and the light-emitting 2 close to each other so that the conductor 6 is leant against the inner side of the extension wall 412 of the frame 41. Next, remelt the conductor 6 to electrically connect the conductive path 42 and the top conductive contact 21 with each other. Finally, fill the filling layer 43 and mount the lens unit 44 on the frame 41, thus the manufacturing of the flip-chip light-emitting module is completed. The aforementioned manufacturing method is exampled a feasible process, and the manufacturer can adjust the sequence or steps of the process according to particular implementations. The manufacturing method of the flip-chip light-emitting module is not limited thereto.

Based on the design of the package assembly 4, the light-emitting chip 2 can be assembled through the technique of flip-chip package which is much easier for assembling and can effectively improve the speed of manufacturing and capacity. In addition, the technique of flip-chip package does not have the disadvantage of wire bonding that has to reserve space for electrically connecting, and can effectively reduce the size of the flip-chip light-emitting module and contribute to the application of miniaturized products.

Figure 5:
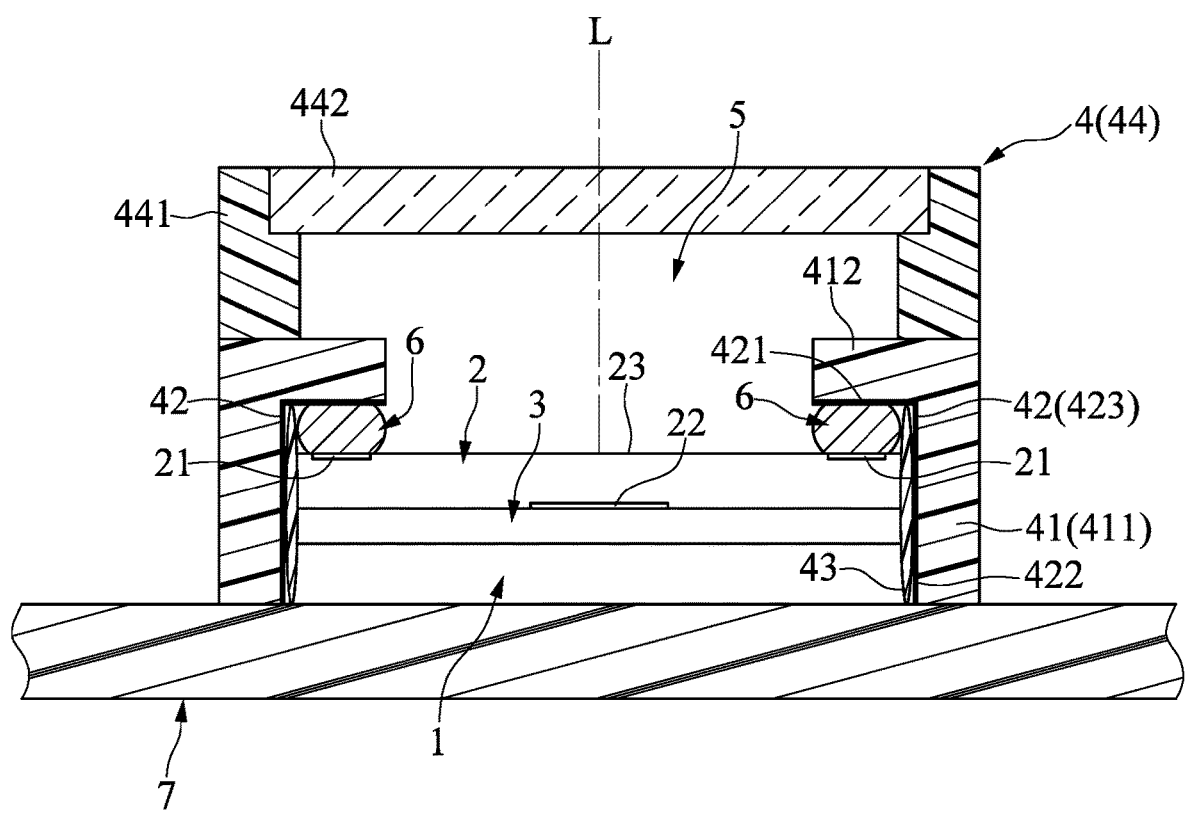
FIG. 5 is a partial cross-sectional view, illustrating another variation of the first embodiment.
Figure 6:
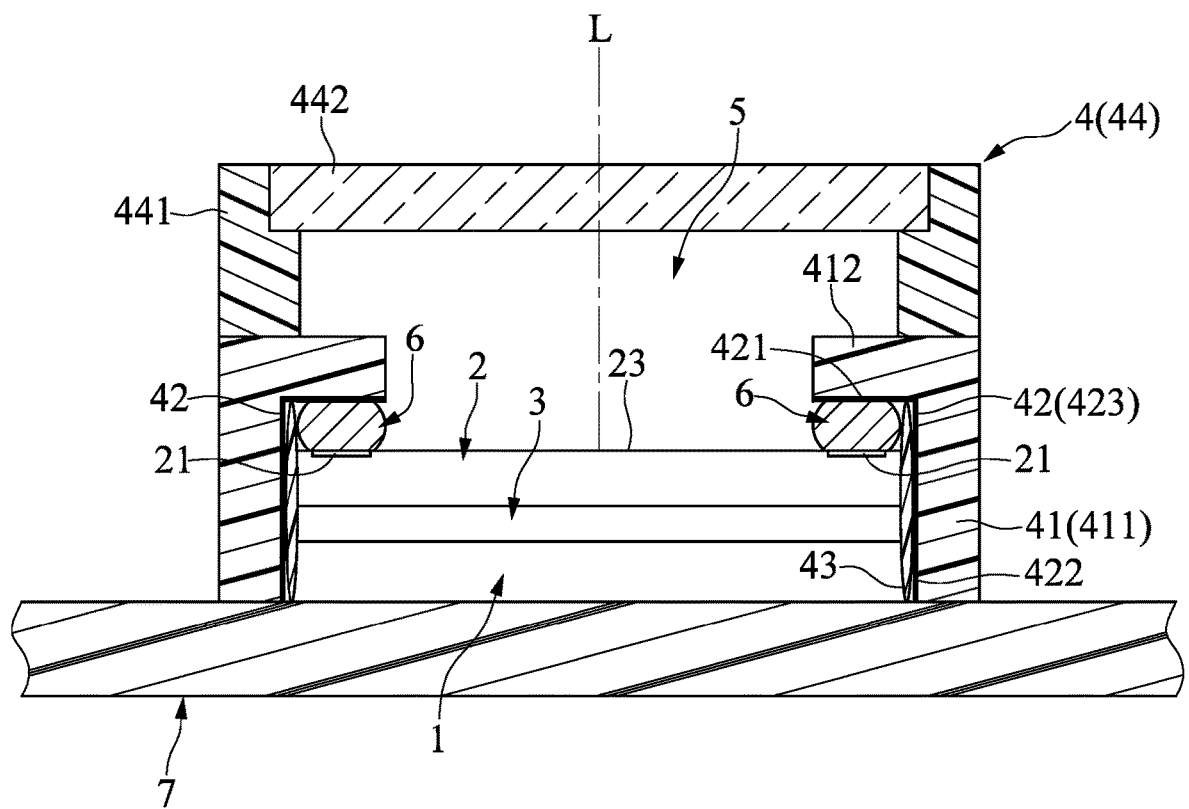
FIG. 6 is a partial cross-sectional view, illustrating another variation of the first embodiment.

It is worth mentioning that the wiring in the package assembly 4 can be adjusted according to the configuration of the top conductive contact 21 and the bottom conductive contact 22 of the light-emitting chip 2. Referred to FIG. 5 which illustrates another variation of the first embodiment, the light-emitting chip 2 further includes another top conductive contact 21, and the top conductive contacts 21 are at the opposite sides of the light-emitting surface 23, respectively. The package assembly 4 further includes another conductive path 42. The flip-chip light-emitting module further includes another conductor 6, and the conductors 6 connect the top conductive contacts 21 and the conductive paths 42, respectively. In this variation, the bottom conductive contact 22 is one of the positive electrode and the negative electrode, and the top conductive contact 21 is the other one of the positive electrode and the negative electrode. It is also worth noting that one of the top conductive contacts 21 can be served as a conductive contact for signal transmission. Referring to FIG. 6 which illustrates the other variation of the first embodiment, the light-emitting chip 2 does not include bottom conductive contact 22 but includes two top conductive contacts 21, in this situation, the top conductive contacts 21 are the positive electrode and the negative electrode, respectively. The package assembly 4 has two conductive paths 42 being electrically connected to the top conductive contacts 21, respectively. However, no matter what configuration of the conductive contacts 21, 22 of the light-emitting chip 2 is, the structure of the package assembly 4 can be assembled with the light-emitting chip 2 through the technique of flip-chip package and has the same effects.

From the above description, the advantages of the first embodiment can be further summarized as follows:

(A) The connection of the light-emitting chip 2 and the thermal dissipation substrate 1 can effectively improve the heat dissipation. In addition, the light-emitting chip 2 can be electrically connected to an external component through the package assembly 4, and space is unnecessary to be reserved for wire bonding, which can effectively reduce the size of the flip-chip light-emitting module and can contribute to the application of miniaturized products.

(B) The extension wall 412 of the frame 41 facilitates the electrical connection between the light-emitting chip 2 and the conductive path 42 of the frame 41. In assembling the flip-chip light-emitting module, the conductor 6 is close to or against the conductive path 42 when it contacts the extension wall 412, and at this time, proceeding electrically connecting, e.g. remelting the soldering ball, can electrically connect the light-emitting chip 2 and the conductive path 42.

(C) The design of the frame 41 is adapted to different configurations of conductive contacts of light-emitting chip 2. As the light-emitting chip 2 is configured with the top conductive contact 21, it can be assembled with the frame 41 through the technique of flip-chip package.

(D) The filling layer 43 fills in the gaps defined by the frame 41, the thermal dissipation substrate 1 and the light-emitting chip 2, and the filling layer 43 makes the structure more stable and prevents relative movement between the frame 41 and the light-emitting chip 2 from dropping and damaging the conductor 6. Furthermore, the filling layer 43 can prevent the conductive path 42 from contacting the thermal dissipation substrate 1 and causing a short circuit. Therefore, the filling layer 43 can improve the overall structural stability and prevent short circuit effect.

(E) Since the light-emitting chip 2 can be packaged by the technique of flip-chip package instead of wire bonding, an electronic product with the light-emitting chip 2 can be rapidly switched without signal delay.

(F) The light-emitting chip 2 of the present disclosure may have two or more conductive contacts, thus the light-emitting chip 2 can simultaneously transmit power and signals.

Second Embodiment

Figure 7:
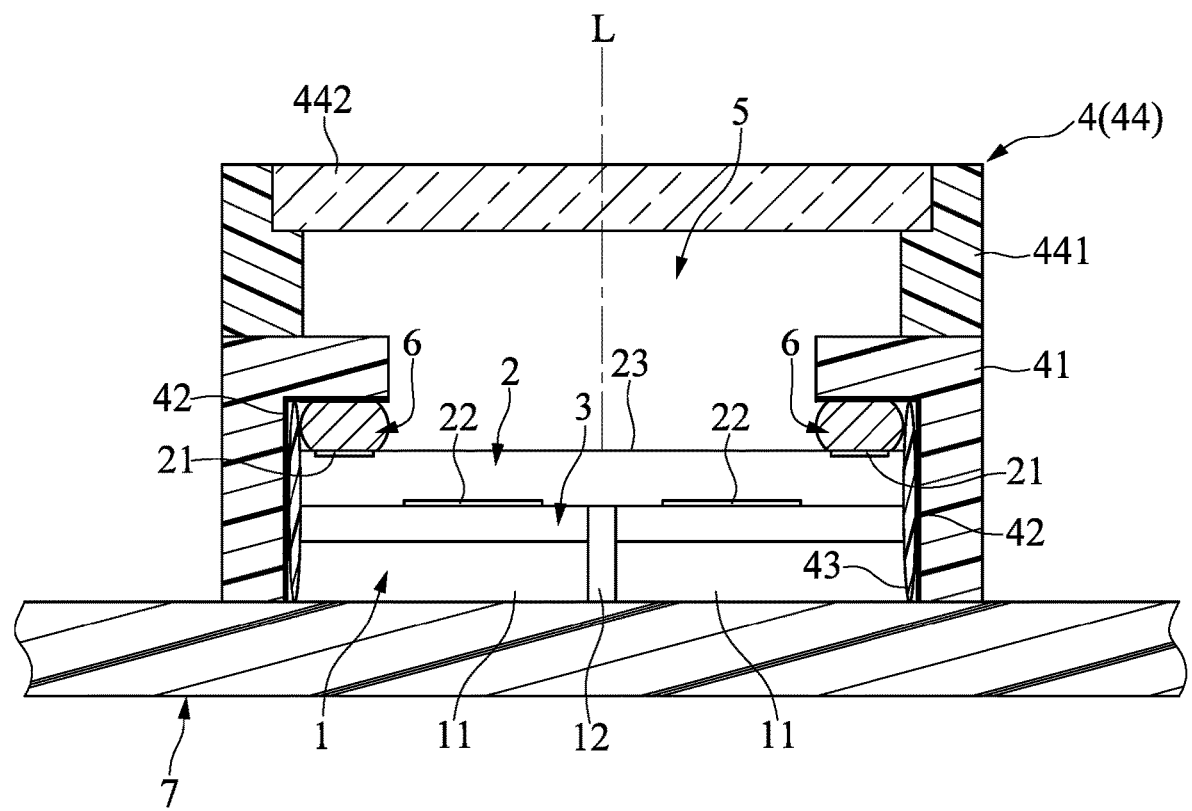
FIG. 7 is a cross-sectional view showing a second embodiment of the present disclosure.

Referring to FIG. 7, a second embodiment of the present disclosure is roughly the same as the first embodiment, and the main difference between the present embodiment and the first embodiment is that the light-emitting chip 2 includes two top conductive contacts 21 and two bottom conductive contacts 22, and correspondingly the thermal dissipation substrate 1 includes two separated plates 11. The adjacent plates 11 together define a thermal dissipation channel 12.

The thermal dissipation substrate 1 may include two, three, or more than four plates 11. The number of the plates 11 can be adjusted according to particular implementations. In this embodiment, the number of the plates 11 is two, and the number of the thermal dissipation channel 12 is one.

Therefore, the second embodiment has the same advantages of the first embodiment, and further discloses another feasible structure of the light-emitting chip 2 that includes multiple bottom conductive contacts 22. Corresponding to this structure, the thermal dissipation substrate 1 has multiple plates 11 to correspond to the conductive contacts 22, and it further improves heat-dissipating effects through the thermal dissipation channel 12 thereof.

It is worth mentioning that even if the light-emitting chip 2 has only one bottom conductive contact 22, a plurality of plates can also be used to constitute the thermal dissipation substrate 1; that is attaching one bottom conductive contact 22 to two or more than three plates 11. In this way, the thermal dissipation substrate 1 still has conductivity and can improve heat-dissipating effects.

Third Embodiment

Figure 8:
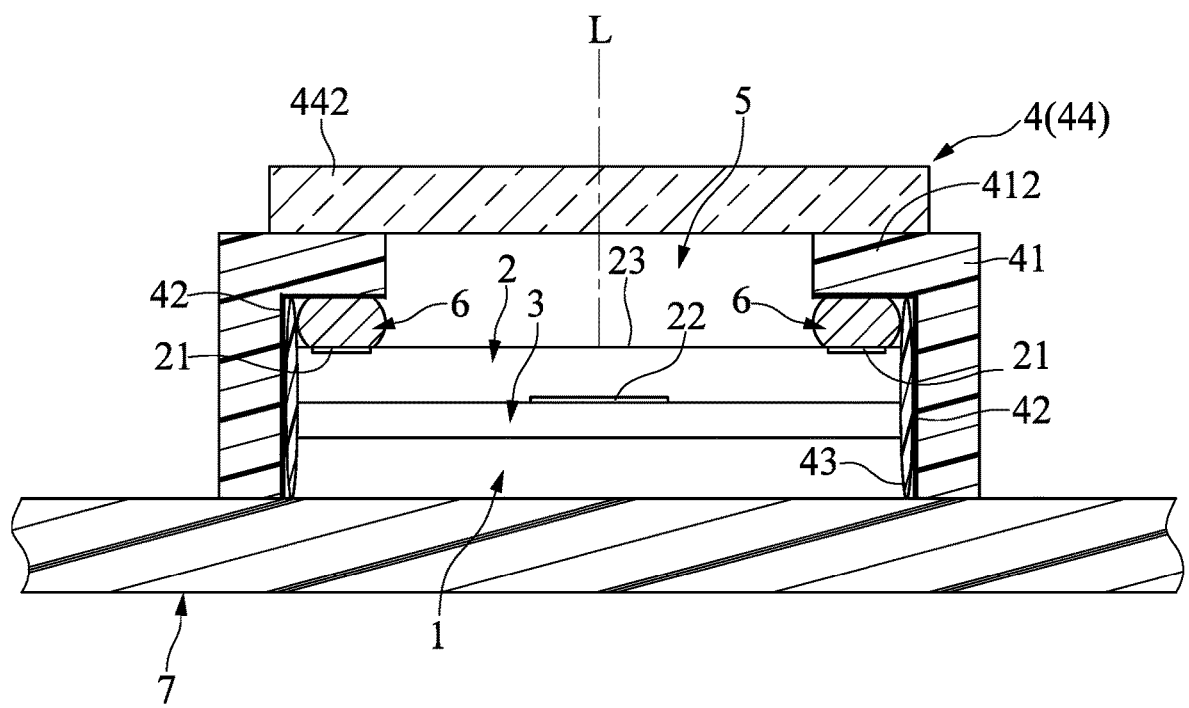
FIG. 8 is a cross-sectional view showing a third embodiment of the present disclosure.

Referring to FIG. 8, a third embodiment of the present disclosure is roughly the same as the first embodiment, and the main difference between the present embodiment and the first embodiment is that the lens unit 44 does not include the support 441 (shown in FIG. 2), and the lens 431 is directly disposed on the frame 41, that is, the frame 41 also has the function of the support 441.

Removing the support 441 (shown in FIG. 2) can further decrease the height of the flip-chip light-emitting module and reduce the overall size. Therefore, the third embodiment has the advantages of the first embodiment, and can further decrease the size of the flip-chip light-emitting module.

Furthermore, the configurations of the conductive contacts 21, 22 of the light-emitting chip 2 are the same as shown in the first embodiment, thus users can adjust them according to their actual needs without any limitation. However, for ease of explanation, the light-emitting chip 2 of the present embodiment is the configuration which has two top conductive contacts 21 and one bottom conductive contact 22.

Fourth Embodiment

Figure 9:
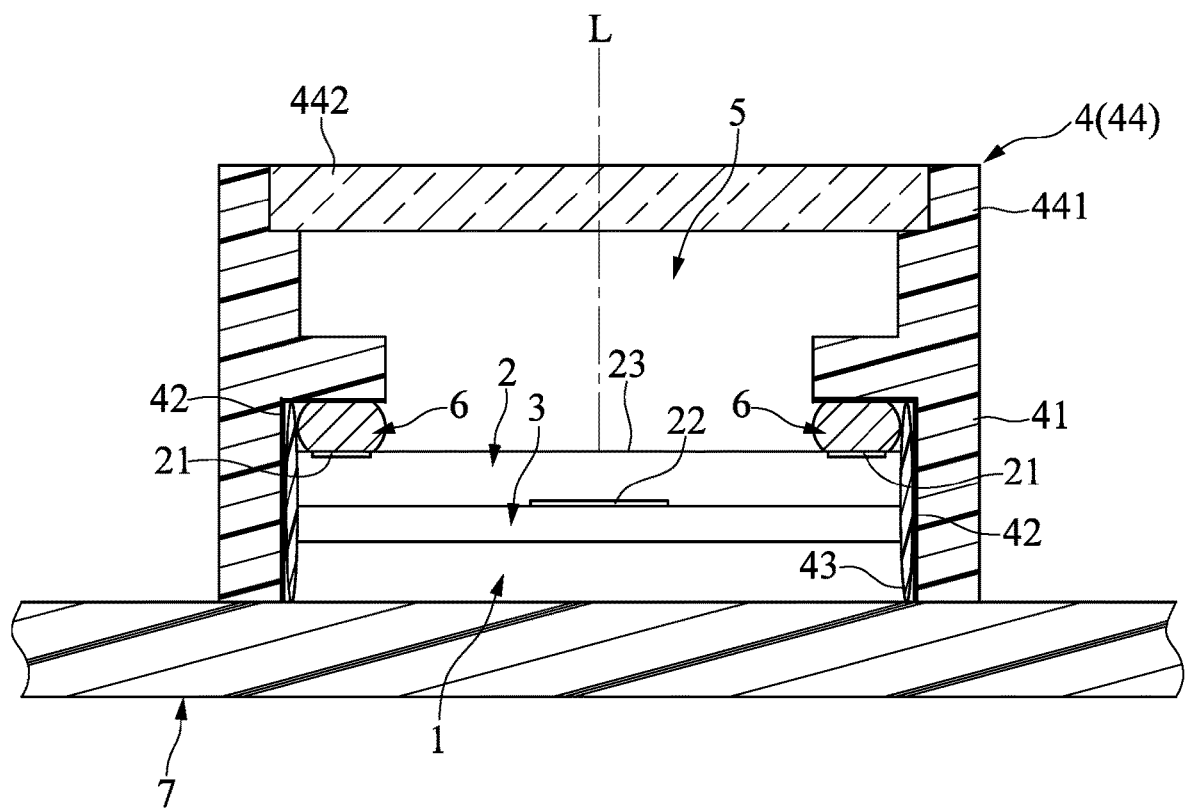
FIG. 9 is a cross-sectional view showing a fourth embodiment of the present disclosure.

Referring to FIG. 9, a fourth embodiment of the present disclosure is roughly the same as the first embodiment, and the main difference between the present embodiment and the first embodiment is that the support 441 and the frame 41 are formed integrally as a one-piece structure.

By forming the support 441 and the frame 41 integrally as a one-piece structure, the step of assembling the aforementioned two elements is not required; however, the strength of the package assembly 4 can be further enhanced.

Therefore, the present embodiment has the advantages of the first embodiment, and further has advantages of simplifying process and increasing the strength of structure.

Furthermore, the configurations of the conductive contacts 21, 22 of the light-emitting chip 2 are the same as shown in the first embodiment, thus users can adjust them according to particular implementations without any limitation.

However, for ease of explanation, the light-emitting chip 2 of the present embodiment is the configuration which has two top conductive contacts 21 and one bottom conductive contact 22.

In conclusion, the structural design of the package assembly 4 enables the light-emitting chip 2 to be assembled by the technique of flip-chip package, and it can save space for wire bonding and can let the light-emitting chip 2 directly attach the thermal dissipation substrate 1, so that the purpose of reducing size and improving heat dissipation can be achieved, and the technical inadequacies of the prior art can be solved. Otherwise, since the light-emitting chip 2 can be packaged by technique of flip-chip package instead of wire bonding, an electronic product with the light-emitting chip 2 can be rapidly switched without signal delay.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A flip-chip light-emitting module, comprising:
   a thermal dissipation substrate including two separated plates, wherein a thermal dissipation channel is formed between the two separated plates;
   two conductive adhesive layers respectively disposed on the two separated plates;
   a package assembly including a frame surrounding the thermal dissipation substrate, and a lens unit disposed on the frame, the frame including a conductive path; and
   a light-emitting chip including a top conductive contact and a light-emitting surface at a same first side, the top conductive contact electrically connected to the conductive path through a conductor, and including two bottom conductive contacts at a second side of the light-emitting chip opposite to the first side respectively contacting the two conductive adhesive layers;
   wherein the frame includes a side wall surrounding the thermal dissipation substrate and an extension wall extending from the side wall to the top conductive contact, the conductive path includes an external connective end disposed on the side wall, and an internal connective end disposed on the extension wall and electrically connected to the top conductive contact through the conductor.

2. The flip-chip light-emitting module according to claim 1, wherein the light-emitting chip includes an optical axis extending outward from the light-emitting surface, the lens unit further includes a support deposited on the frame and a lens, the support and the frame together define an light channel around the optical axis, and the lens is deposed on the support and is in the light channel.

3. The flip-chip light-emitting module according to claim 1, wherein the two separated plates of the thermal dissipation substrate correspond to the bottom conductive contacts so as to improves a heat-dissipating effect through the thermal dissipation channel between the two separated plates.

4. The flip-chip light-emitting module according to claim 1, wherein the package assembly includes a filling layer filled between the frame and the thermal dissipation substrate.

5. The flip-chip light-emitting module according to claim 1, wherein the frame of the package assembly is made of a ceramic material, and the light-emitting chip is selected from the group consisting of light-emitting diodes, resonant-cavity light-emitting diodes, and vertical-cavity surface-emitting laser chips.

\* \* \* \* \*